(12) United States Patent
Kobayashi et al.

(10) Patent No.: US 9,375,914 B2
(45) Date of Patent: *Jun. 28, 2016

(54) PASTE SUPPLY APPARATUS, SCREEN PRINTING MACHINE, PASTE SUPPLY METHOD AND SCREEN PRINTING METHOD

(71) Applicant: Panasonic Corporation, Osaka (JP)

(72) Inventors: Hiroki Kobayashi, Yamanashi (JP); Masayuki Mantani, Yamanashi (JP); Hideki Uchida, Yamanashi (JP); Minoru Murakami, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/269,596

(22) Filed: May 5, 2014

(65) Prior Publication Data
US 2014/0366754 A1    Dec. 18, 2014

(30) Foreign Application Priority Data
Jun. 12, 2013  (JP) .................................. 2013-123506

(51) Int. Cl.
| B41F 15/40 | (2006.01) |
| B41F 15/42 | (2006.01) |
| B41F 15/44 | (2006.01) |
| H05K 3/34  | (2006.01) |
| H05K 3/12  | (2006.01) |

(52) U.S. Cl.
CPC .................. *B41F 15/40* (2013.01); *B41F 15/42* (2013.01); *B41F 15/44* (2013.01); *H05K 3/1233* (2013.01); *H05K 3/3484* (2013.01); *B41P 2215/50* (2013.01)

(58) Field of Classification Search
CPC ...... B41F 15/40; B41F 15/42; B41F 15/0813; B41F 15/44; B23K 3/06; B41P 2215/50; H05K 3/1233; H05K 3/3484
USPC ........................................... 101/123; 222/342
See application file for complete search history.

(56) References Cited

U.S. PATENT DOCUMENTS

| 3,153,815 A * | 10/1964 | Seidl .................... B29C 45/0005 |
| | | 222/342 |
| 5,806,423 A * | 9/1998 | Tani .............................. 101/123 |

(Continued)

FOREIGN PATENT DOCUMENTS

| JP | 08-207243 | * | 8/1996 | .............. B41F 15/40 |
| JP | 2010-172928 A | | 8/2010 | |
| JP | 2011-140176 A | | 7/2011 | |

*Primary Examiner* — Blake A Tankersley
*Assistant Examiner* — Marissa Ferguson Samreth
(74) *Attorney, Agent, or Firm* — Pearne & Gordon LLP

(57) ABSTRACT

A paste supply apparatus includes a plurality of paste pots each including a bottomed tubular container storing paste and a movable inner lid provided in the tubular container and having a through hole formed in a center portion thereof, and a pot holder which holds the paste pots so as to be horizontally arranged along an arrangement direction such that the through hole of each of the paste pots is directed downward and downward movement of the inner lid thereof is regulated. The paste supply apparatus further includes a pot holder moving device which moves the pot holder along the arrangement direction and selectively positions one of the plurality of paste pots at an ejection position, and a paste ejecting device which presses the tubular container of the paste pot positioned at the ejection position and which ejects the paste in the tubular container from the through hole.

8 Claims, 13 Drawing Sheets

(56) References Cited

U.S. PATENT DOCUMENTS

| | | | |
|---|---|---|---|
| 2002/0053292 A1* | 5/2002 | Abe et al. | 101/123 |
| 2003/0084797 A1* | 5/2003 | Abe et al. | 101/123 |
| 2004/0187716 A1* | 9/2004 | Pham-Van-Diep et al. | 101/123 |
| 2004/0244612 A1* | 12/2004 | Willshere | 101/123 |
| 2009/0294483 A1* | 12/2009 | Kim | 222/386 |
| 2011/0315029 A1 | 12/2011 | Abe et al. | |
| 2012/0138664 A1* | 6/2012 | Sumioka | 228/102 |

* cited by examiner

PASTE SUPPLY APPARATUS, SCREEN PRINTING MACHINE, PASTE SUPPLY METHOD AND SCREEN PRINTING METHOD

BACKGROUND

1. Technical Field

An aspect of the present invention relates to a paste supply apparatus for supplying paste to a mask positioned to contact a substrate in a screen printing machine, the screen printing machine, a paste supply method and a screen printing method.

2. Background Art

As a paste supply apparatus for supplying paste to a mask positioned to contact a substrate in a screen printing machine, JP-A-2011-140176 describes an apparatus for ejecting and supplying paste to a mask from a syringe in which the paste is stored. The paste stored in the syringe is provided from a hermetically closed container called a paste pot filled with paste. The paste pot includes a tubular container and an inner lid inserted into the tubular container. JP-A-2010-172928 describes a paste supply apparatus which uses the paste pot itself as a syringe rather than refilling the syringe with paste from the paste pot.

SUMMARY

However, in the case of using the paste pot itself as the syringe as described above, paste supply cannot be continued unless the paste pot is replaced with a new paste pot when ejection of the paste in the paste pot is completed. Consequently, work efficiency decreases since operation of whole functions of the screen printing machine must be stopped in order to replace the paste pot.

An object of an aspect of the invention is to provide a paste supply apparatus, a screen printing machine, a paste supply method and a screen printing method, which can replace a paste pot without stopping operation of whole functions of the screen printing machine.

In a first aspect, a paste supply apparatus includes: a plurality of paste pots, each of which includes a moveable bottomed tubular container which stores paste and an inner lid which is provided in the moveable bottomed tubular container and which has a through hole formed in a center portion of the inner lid; a pot holder which holds the plurality of paste pots so as to be horizontally arranged along an arrangement direction such that the through hole of each of the plurality of paste pots is directed downward and downward movement of the moveable bottomed tubular container thereof is regulated; a pot holder moving device which moves the pot holder along the arrangement direction and which selectively positions one of the plurality of paste pots at an ejection position; and a paste ejecting device which presses the moveable bottomed tubular container of the paste pot positioned at the ejection position by the pot holder moving device with respect to the inner lid and which ejects the paste stored in the moveable bottomed tubular container from the through hole.

In a second aspect, a screen printing machine includes: a mask which is positioned to contact a substrate; a paste supply apparatus according to the first aspect, which ejects and supplies the paste to the mask contacting the substrate; and a squeegee slid on the mask to which the paste is supplied by the paste supply apparatus.

In a third aspect, a paste supply method includes: holding a plurality of paste pots, each of which includes a moveable bottomed tubular container which stores paste and a an inner lid which is provided in the moveable tubular container and which has a through hole formed in a center portion of the inner lid, so as to be horizontally arranged along an arrangement direction in a pot holder such that the through hole of each of the plurality of paste pots is directed downward and downward movement of the bottomed tubular container thereof is regulated; moving the pot holder in the arrangement direction and selectively positioning one of the plurality of paste pots at an ejection position; and pressing the moveable bottomed tubular container of the paste pot positioned at the ejection position with respect to the inner lid and ejecting the paste stored in the moveable bottomed tubular container from the through hole.

In a fourth aspect, a screen printing method includes: positioning a mask to contact a substrate; ejecting and supplying the paste from the paste supply apparatus according to the first aspect to the mask contacting the substrate; and sliding a squeegee on the mask to which the paste is supplied.

According to an aspect of the invention, after ejection of paste in one paste pot (first paste pot) is completed, another paste pot (second paste pot) is positioned at the ejection position and also the empty (first) paste pot is positioned at a position deviating from the ejection position. Consequently, the paste can subsequently be ejected from the second paste pot. Further, during that period, the empty (first) paste pot can be replaced with a new paste pot, whereby the paste pot can be replaced without stopping operation of whole functions of the apparatus (for example, the screen printing machine) which receives supply of the paste. Therefore, work efficiency can be improved.

DETAILED DESCRIPTION

Figure 1:
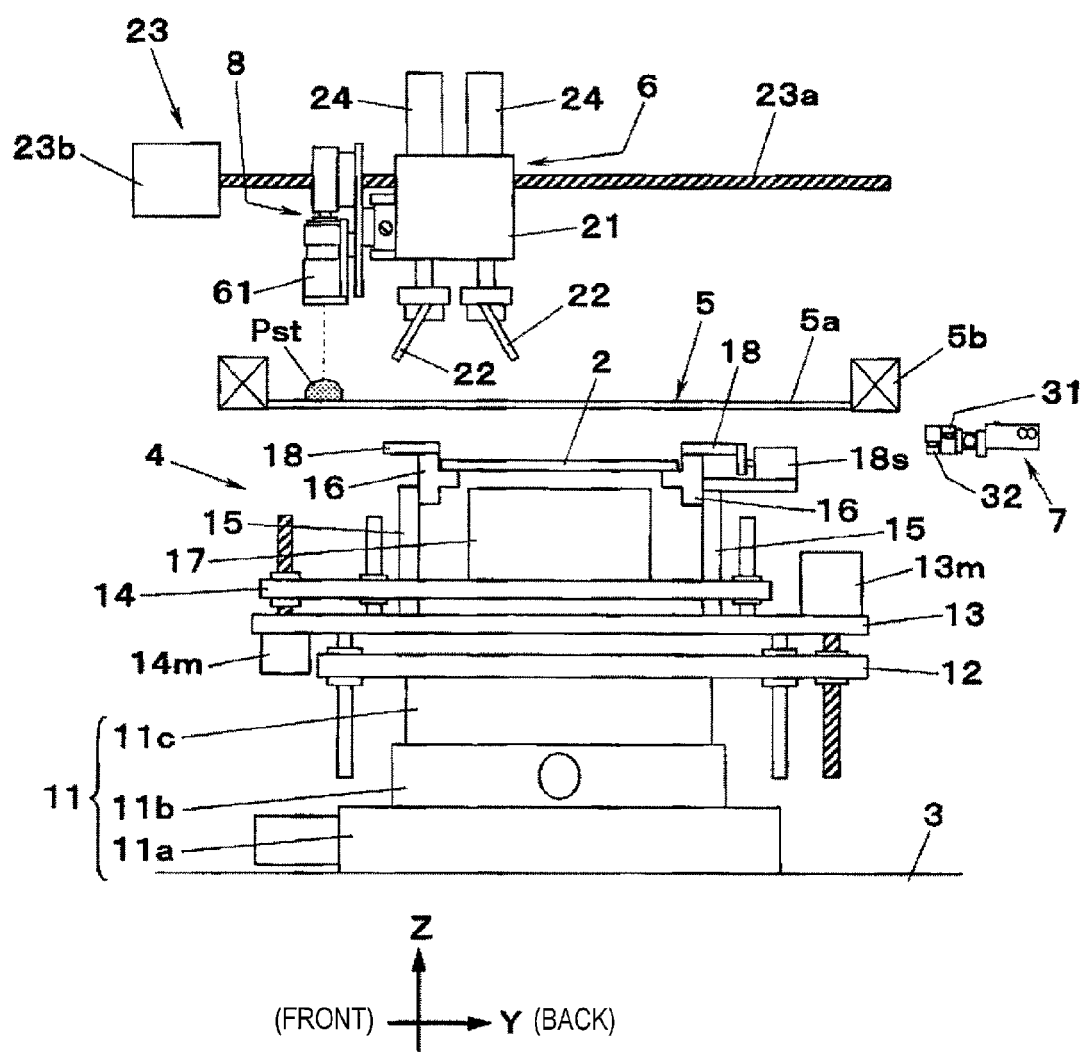
FIG. 1 is a side view of a screen printing machine in one embodiment of the invention.
Figure 2:
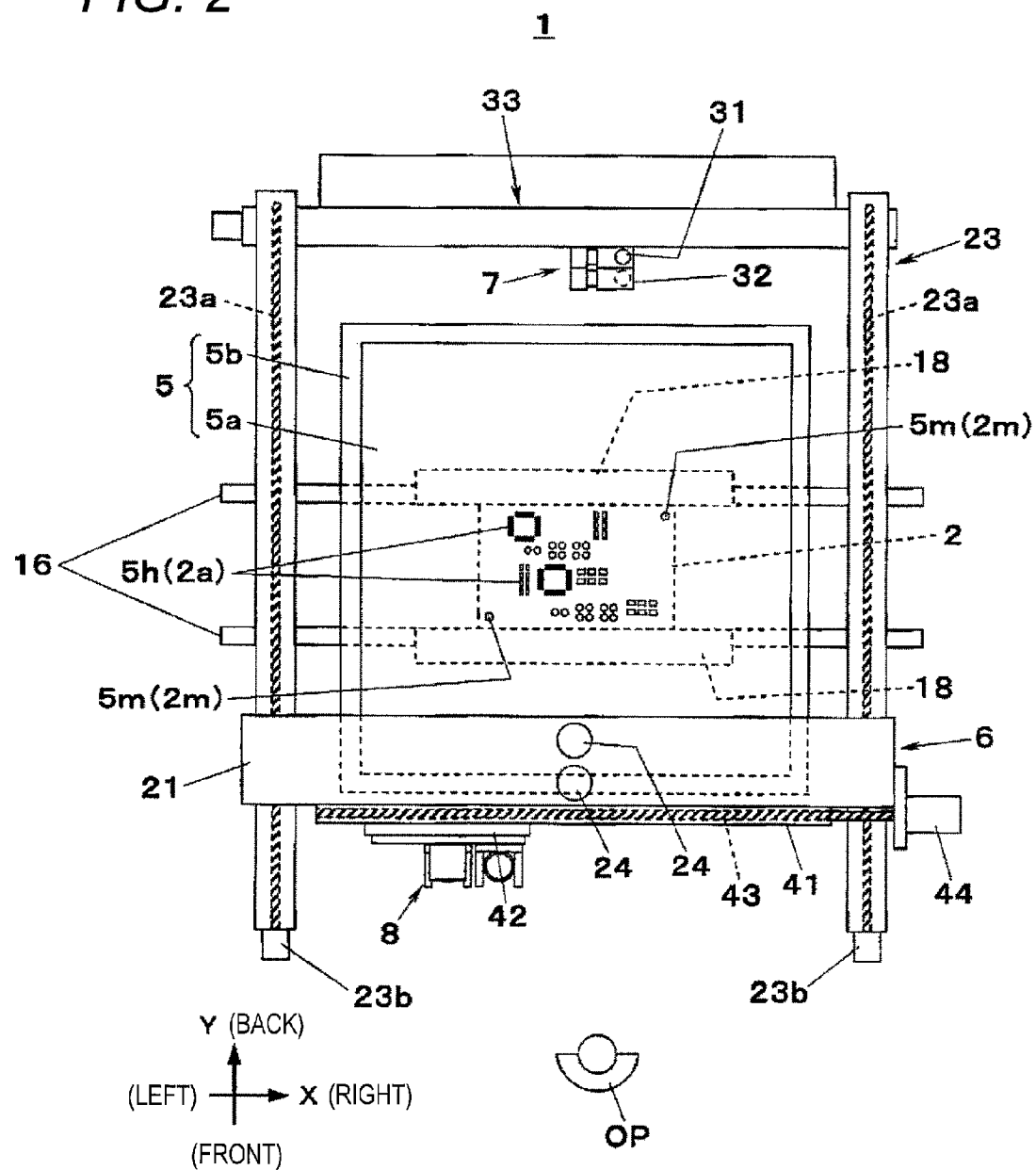
FIG. 2 is a plan view of the screen printing machine in one embodiment of the invention.

An embodiment of the invention will hereinafter be described with reference to the drawings. A screen printing machine 1 shown in FIGS. 1 and 2 is a machine for repeatedly performing screen printing of paste Pst such as solder paste on a substrate 2. The screen printing machine 1 includes: a substrate holding/moving unit 4 which is provided on a base 3 and which holds and moves the substrate 2; a mask 5 horizontally disposed above the substrate holding/moving unit 4; a squeegee unit 6 provided above the mask 5; a camera unit 7 provided under the mask 5; and a paste supply apparatus 8 provided integrally with the squeegee unit 6 above the mask 5.

As shown in FIG. 1, the substrate holding/moving unit 4 includes: an XYθ movement mechanism 11 provided on the base 3; a base table 12 which is movable on a horizontal plane and rotatable around a vertical axis by the XYθ movement mechanism 11. The substrate holding/moving unit 4 further includes a first lifting table 13 and a second lifting table 14, which are provided on the base table 12 in this order from the downward side.

The XYθ movement mechanism 11 includes a stack of a Y-axis table 11a, an X-axis table 11b and a θ table 11c. The Y-axis table 11a extends in a Y-axis direction (a front-back direction viewed from an operator OP shown in FIG. 2, and the left-right direction in FIG. 1) on the base 3. The X-axis table 11b extends along an X-axis direction (the left-right direction viewed from the operator OP, and the direction orthogonal to the sheet of FIG. 1) on the Y-axis table 11a. The θ table 11c is provided on the X-axis table 11b. The X-axis table 11b is moved on the Y-axis table 11a along the Y-axis direction by driving of the Y-axis table 11a, and the θ table 11c is moved on the X-axis table 11b along the X-axis direction by driving of the X-axis table 11b, and the base table 12 is rotated around vertical axis (Z axis) in FIG. 1 by driving of the θ table 11c. That is, the base table 12 is moved in the horizontal plane by an XYθ movement mechanism 11. The first lifting table 13 is moved upward and downward with respect to the base table 12 by driving of a first lifting table moving motor 13m, and the second lifting table 14 is moved upward and downward with respect to the first lifting table 13 by driving of a second lifting table moving motor 14m.

A pair of conveyor support members 15 is provided to extend upward from the first lifting table 13 and penetrate the second lifting table 14. The pair of conveyor support members 15 supports a pair of conveyors 16 extending in the X-axis direction. The conveyors 16 oppose each other in the Y-axis direction. The pair of conveyors 16 supports both ends of the substrate 2 from the downward side and conveys the substrate 2 in the X-axis direction. On an upper surface of the second lifting table 14, a receiving member 17 is provided.

A pair of clamp members (clampers 18) extending along the Y-axis direction and opposing each other in the X-axis direction is provided on an upper side of the pair of conveyors 16. The pair of clampers 18 is opened and closed in the Y-axis direction by actuation of a damper open/close cylinder 18s, and grasps and holds (clamps) both ends of the substrate 2 on the conveyors 16.

As shown in FIG. 2, the mask 5 includes: a plate portion 5a with a flat plate shape extending in an XY plane; and a frame-shaped portion 5b for holding the outer periphery of the plate portion 5a. An inside of a rectangular region of the plate portion 5a surrounded by the frame-shaped portion 5b is provided with pattern holes 5h so as to correspond to electrodes 2a formed on the substrate 2.

In FIG. 2, the substrate 2 includes a set of two substrate side marks 2m at diagonal positions thereof, and the plate portion 5a of the mask 5 includes a set of two mask side marks 5m arranged to correspond to the substrate side marks 2m. When the substrate 2 is positioned to contact the mask 5 in a state in which the substrate side marks 2m overlap with the mask side marks 5m in plan view, the electrodes 2a of the substrate 2 become matching with the pattern holes 5h of the mask 5.

Figure 3:
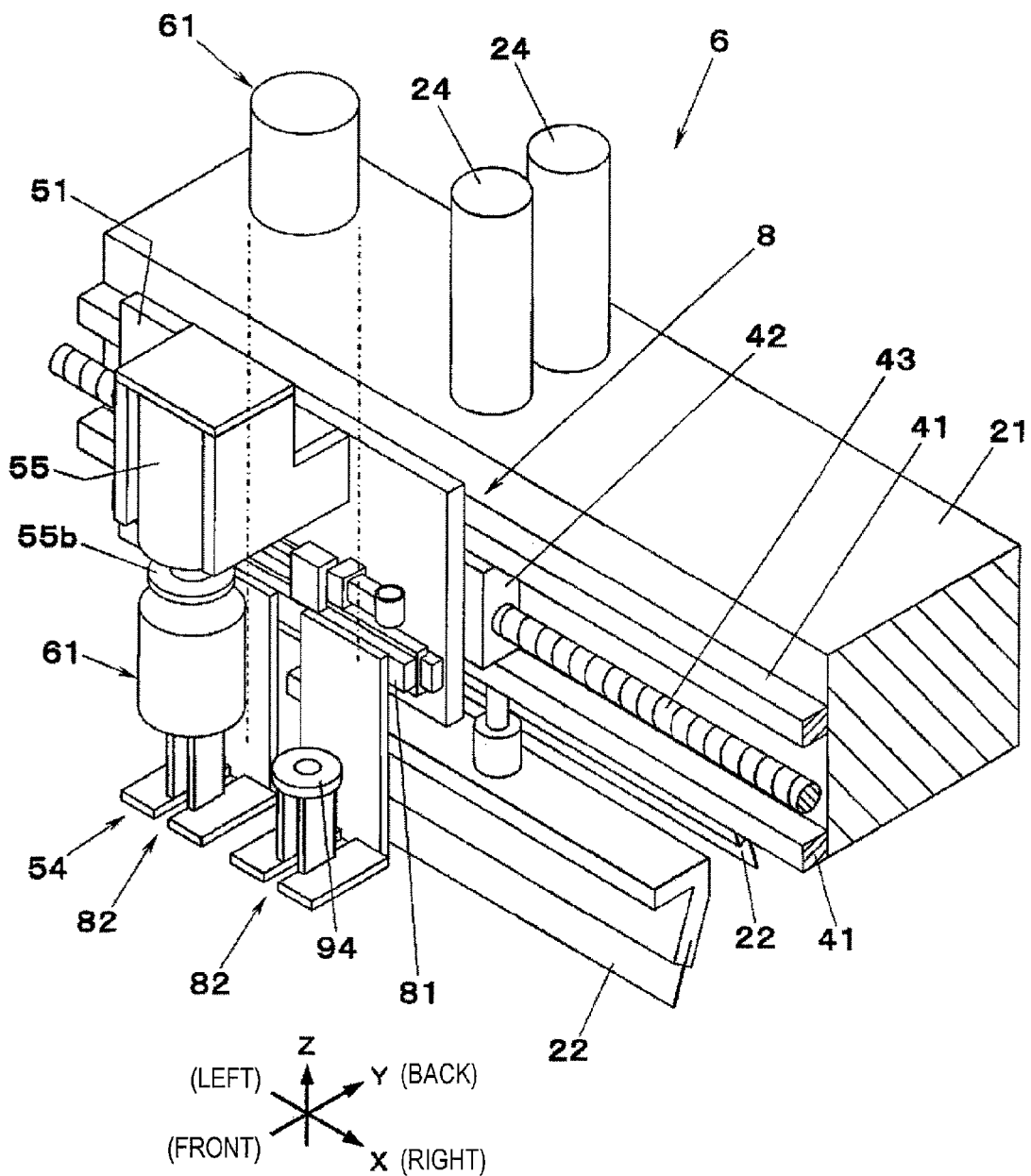
FIG. 3 is a perspective view of a squeegee unit and a paste supply apparatus provided in the screen printing machine in one embodiment of the invention.

In FIGS. 1 to 3, the squeegee unit 6 includes: a squeegee base 21 extending in the X-axis direction; two squeegees 22 which are provided below the squeegee base 21 and arranged to oppose each other in the Y-axis direction; and a squeegee unit moving mechanism 23 which moves the squeegee base 21 in the Y-axis direction. The squeegee unit moving mechanism 23 includes: a pair of squeegee unit moving ball screws 23a which are arranged to oppose each other in the X-axis direction and extend in the Y-axis direction above the mask 5; and two squeegee unit moving motors 23b which rotate and drive the respective squeegee unit moving ball screws 23a. The squeegee unit moving ball screws 23a are respectively screwed through the left and right ends of the squeegee base 21. As a result, when the squeegee unit moving ball screws 23a are rotated forward or backward in synchronization by the two squeegee unit moving motors 23b, the squeegee base 21 is moved along the Y-axis direction according to this rotation. The two squeegees 22 are individually moved upward and downward with respect to the squeegee base 21 by a squeegee moving cylinder 24 formed on the squeegee base 21.

In FIGS. 1 and 2, the camera unit 7 includes: an upward imaging camera 31 with an imaging visual field oriented upward; and a downward imaging camera 32 with an imaging visual field oriented downward. The camera unit 7 is moved in a horizontal plane by a camera unit moving mechanism 33.

In FIGS. 1 and 2, the paste supply apparatus 8 ejects and supplies the paste Pst to the mask 5 positioned to contact the substrate 2, and is provided on the front side of the squeegee base 21. As shown in FIG. 3, a pair of guide members 41 extending in the X-axis direction is arranged on upper and lower positions in the front of the squeegee base 21, and a ball screw 43 extending in the X-axis direction is screwed through a block member 42 guided to the pair of guide members 41. The ball screw 43 is rotatable by a paste supply apparatus moving motor 44 provided on the end of the squeegee base 21, and the block member 42 is moved in the X-axis direction by forward and backward rotation of the ball screw 43 by the paste supply apparatus moving motor 44.

Figure 4A:
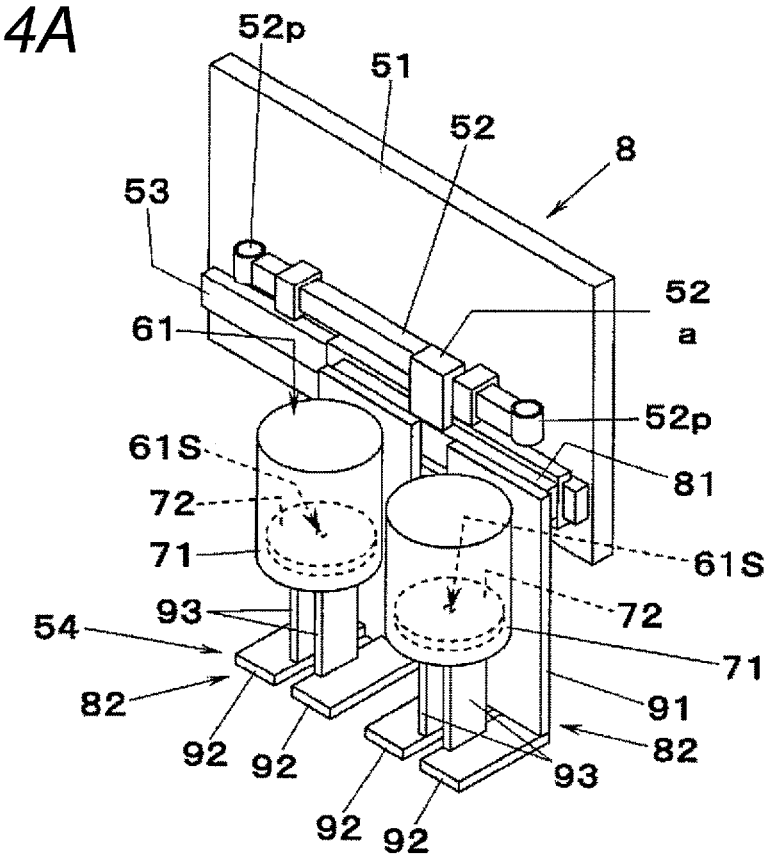
FIG. 4A is a perspective view of the paste supply apparatus in one embodiment of the invention.
Figure 4B:
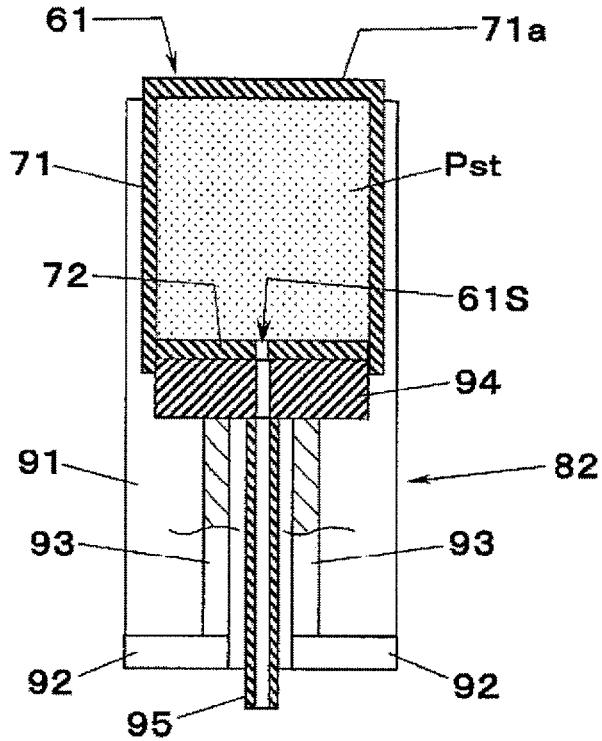
FIG. 4B is a partially sectional front view of a pot attachment portion of the paste supply apparatus.

As shown in FIGS. 3, 4A and 4B, the paste supply apparatus 8 includes: a base plate 51 attached to the block member 42 and extending in a vertical direction; a moving cylinder 52 made of, for example, a rod-less cylinder provided on the front of the base plate 51 so as to extend along the X-axis direction; a pot holder 54 including a base portion 81 movable along the X-axis direction on a guide 53 extending along the X-axis direction by the moving cylinder 52; and a pressing cylinder 55 provided above the pot holder 54. The pot holder 54 holds a plurality of paste pots 61 (two paste pots, in the embodiment) storing the paste Pst in a state in which the paste pots 61 are arranged along the X-axis direction.

Figure 5A:
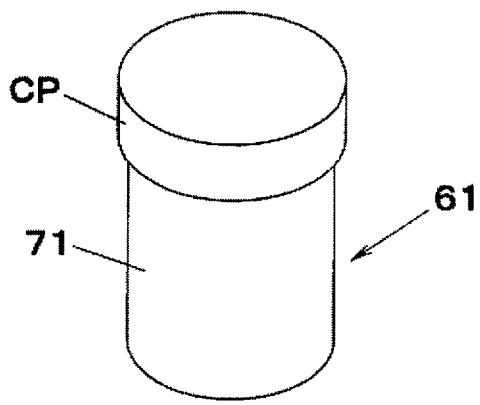
FIGS. 5A to 5D are perspective views of a paste pot used in the paste supply apparatus in one embodiment of the invention.
Figure 5B:
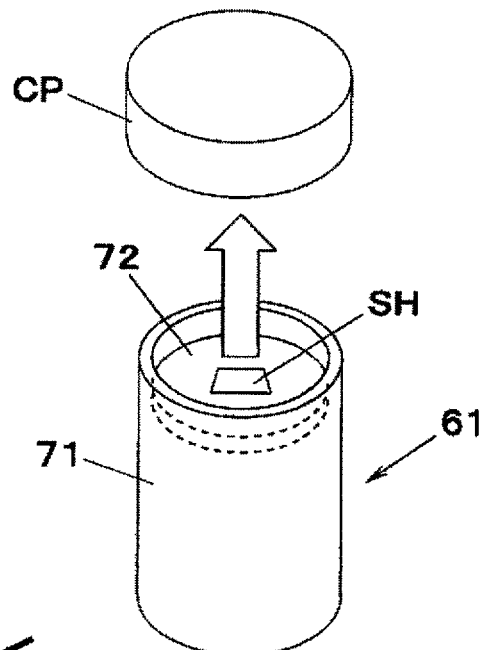
Figure 5C:
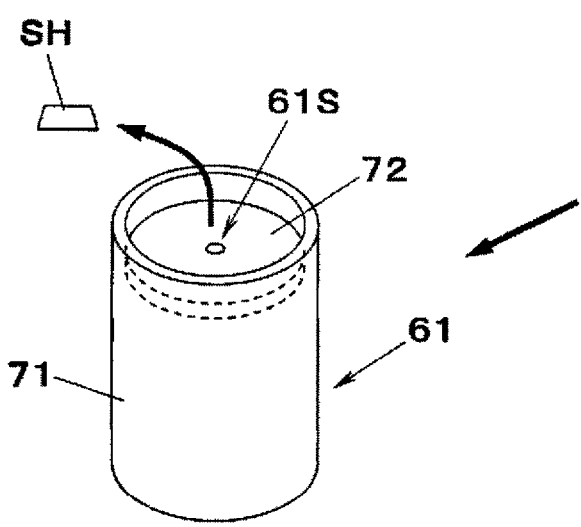
Figure 5D:
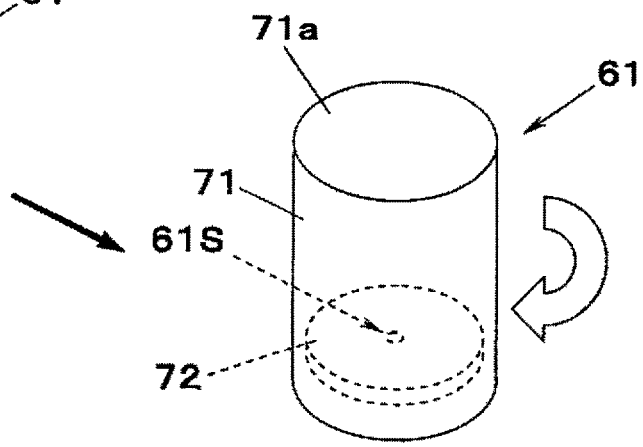

The paste pot 61 includes: a tubular container 71 which includes a bottom portion 71a and which stores the paste Pst; and an inner lid 72 inserted into the tubular container 71. The inner lid 72 has a through hole 61S formed in the center of the inner lid 72. Before use of the paste pot 61, a cap CP attached to an open end thereof is detached (from FIG. 5A to FIG. 5B), an adhesive sheet SH sealing the through hole 61S is peeled from the inner lid 72 (FIG. 5C), and then the paste pot 61 is turned upside down to have an attitude in which the through hole 61S is directed downward (Fig. SD).

As shown in FIGS. 3, 4A and 4B, the pot holder 54 includes: a base portion 81 having a shape extending along the X-axis direction; and two pot attachment portions 82 arranged on the front of the base portion 81 in the X-axis direction. Each of the pot attachment portions 82 includes: a plate-shaped basal portion 91 extending downward from the base portion 81; left and right lower extending portions 92 which extends forward from a lower portion of the basal portion 91; left and right inner lid support posts 93 which extends upward from the inner ends in the left-right direction of the respective lower extending portions 92; a ring-shaped inner lid support portion 94 (also see FIG. 3) which is attached to the upper ends of the inner lid support posts 93 and which has a hole with an inner diameter larger than that of the through hole 61S of the paste pot 61 in a center of the inner lid support portion 94; and a hollow nozzle portion 95 which extends downward from the inner lid support portion 94 and which is connected to the hole of the inner lid support portion 94.

The paste pot 61 is attached to the pot attachment portion 82 with the attitude in which the through hole 61S directed downward such that the inner lid 72 abuts on the inner lid support portion 94 from above (to receive the inner lid support portion 94). Accordingly, the two paste pots 61 are arranged and held in the horizontal direction (X-axis direction) such that the through hole 61S is directed downward and downward movement of the tubular container 71 is regulated (FIGS. 3, 4A and 4B). In this state, the through hole 61S of the inner lid 72 is positioned concentrically with the nozzle portion 95 (FIG. 4B).

The moving cylinder 52 can move a moving body 52a from side to side (along the X-axis direction) by supplying and draining air to and from left and right ports 52p, thereby moving the pot holder 54 joined to the moving body 52a from side to side. The pot holder 54 is selectively positioned at a first position (position shown in FIG. 3) or a second position by the moving cylinder 52. At the first position, the paste pot 61 attached to the left the left pot attachment portion 82 is positioned at an ejection position, and the paste pot 61 attached to the right pot attachment portion 82 is positioned at a standby position deviating from the ejection position. At the second position, the paste pot 61 attached to the right pot attachment portion 82 is positioned at the ejection position, and the paste pot 61 attached to the left pot attachment portion 82 is positioned at the standby position deviating from the ejection position. That is, in the embodiment, the moving cylinder 52 serves as an example of a pot holder moving device which moves the pot holder 54 along the direction (X-axis direction) in which the plurality of (two, in the embodiment) paste pots 61 are arranged, and which selectively positions one of the plurality of paste pots 61 at the ejection position. The ejection position is a position at which the paste Pst stored in the paste pot 61 is ejected. In the embodiment, the ejection position is a position at which the paste Pst can be pressed by the pressing cylinder 55. For example, the ejection position is located below the pressing cylinder 55, and the drawings of the embodiment show the ejection position located immediately below or substantially immediately below the pressing cylinder 55. The ejection position is not limited thereto as long as the paste Pst stored in the paste pot 61 can be ejected by the screen printing machine 1.

In FIG. 3, the pressing cylinder 55 is attached to an upper region of the base plate 51 such that a piston rod 55a is directed downward, and a pad member 55b is attached to a lower end of the piston rod 55a. When the pressing cylinder 55 moves the piston rod 55a downward to protrude, the pad member 55b depresses the moveable bottomed tubular container 71 of the paste pot 61 (downward movement of the moveable bottomed tubular container 71 of the paste pot 61 is regulated as described above) positioned at the ejection position with respect to the inner lid 72, thereby applying pressure to the paste Pst stored in the tubular container 71 and ejecting the paste Pst downward from the through hole 61S.

In the embodiment, the pressing cylinder 55 serves as an example of a paste ejecting device which presses the moveable bottomed tubular container 71 of the paste pot 61 positioned at the ejection position by the moving cylinder 52 with respect to the inner lid 72 and which ejects the paste from the through hole 61S.

Figure 6:
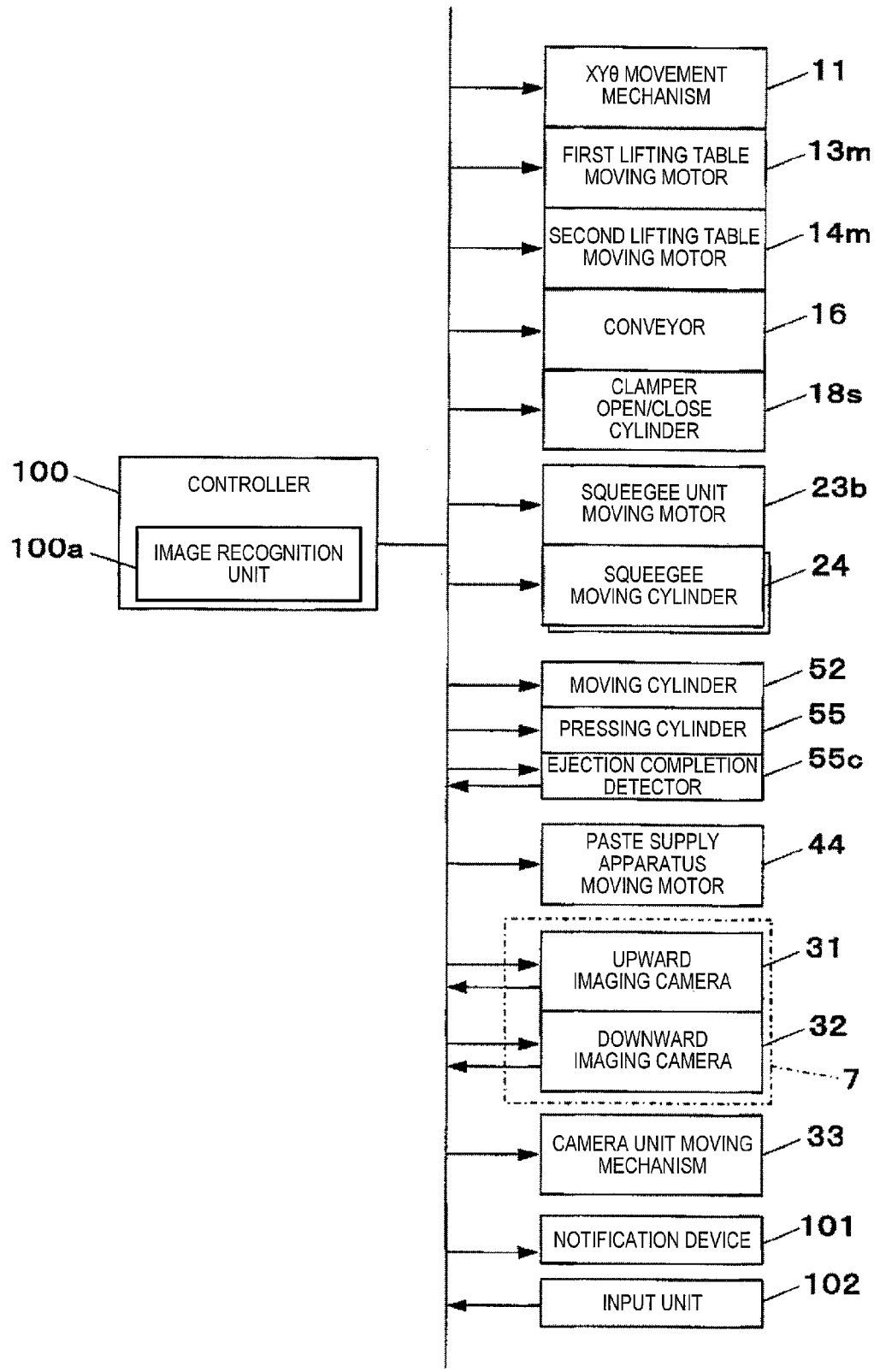
FIG. 6 is a block diagram showing a control system of the screen printing machine in one embodiment of the invention.

The screen printing machine 1 includes a controller 100. The controller 100 controls: conveyance operation of the substrate 2 in the X-axis direction by the conveyors 16 of the substrate holding/moving unit 4; upward and downward movement operation (support operation of a lower surface of the substrate 2 described below) of the second lifting table 14 by the second lifting table moving motor 14m; substrate clamp operation of the clampers 18 by the clamper open/close cylinder 18s; movement operation of the substrate 2 in the horizontal plane by the XYθ movement mechanism 11; and upward and downward movement operation (upward and downward movement operation of the clamped substrate 2 described below) of the first lifting table 13 by the first lifting table moving motor 13m (FIG. 6). The controller 100 also controls: movement operation of the squeegee unit 6 and the paste supply apparatus 8 along the Y-axis direction by the squeegee unit moving motors 23b; movement operation of the paste supply apparatus 8 along the X-axis direction by the paste supply apparatus moving motor 44; and upward and downward movement operation of each of the squeegees 22 by the squeegee moving cylinder 24 (FIG. 6). The controller 100 also controls: movement operation of the pot holder 54 along the X-axis direction by the moving cylinder 52; and ejection operation of the paste Pst from the paste pot 61 by the pressing cylinder 55 (FIG. 6).

The controller 100 controls movement operation of the camera unit 7 in the horizontal plane by the camera unit moving mechanism 33; imaging operation of the upward imaging camera 31 provided in the camera unit 7; and imaging operation of the downward imaging camera 32 provided in the camera unit 7 (FIG. 6). The image data obtained by the imaging operation of the upward imaging camera 31 and the image data the imaging operation of the downward imaging camera 32 are inputted to the controller 100, and image recognition processing is performed in an image recognition unit 100a (FIG. 6).

A supply procedure of the paste Pst (paste supply method) performed by the paste supply apparatus 8 will be described. At first, the operator OP attaches the two paste pots 61 to the left and right pot attachment portion 82 of the pot holder 54 from above (FIG. 3), respectively, so as to hold the paste pots 61 to be horizontally arranged in the pot holding part 54 such that the through holes 61S are directed downward and downward movement thereof is regulated (a pot holding step). In addition, the paste pot 61 is attached to the pot attachment portion 82 in a state in which the pot attachment portion 82 is positioned at the standby position deviating from the ejection position.

Figure 7A:
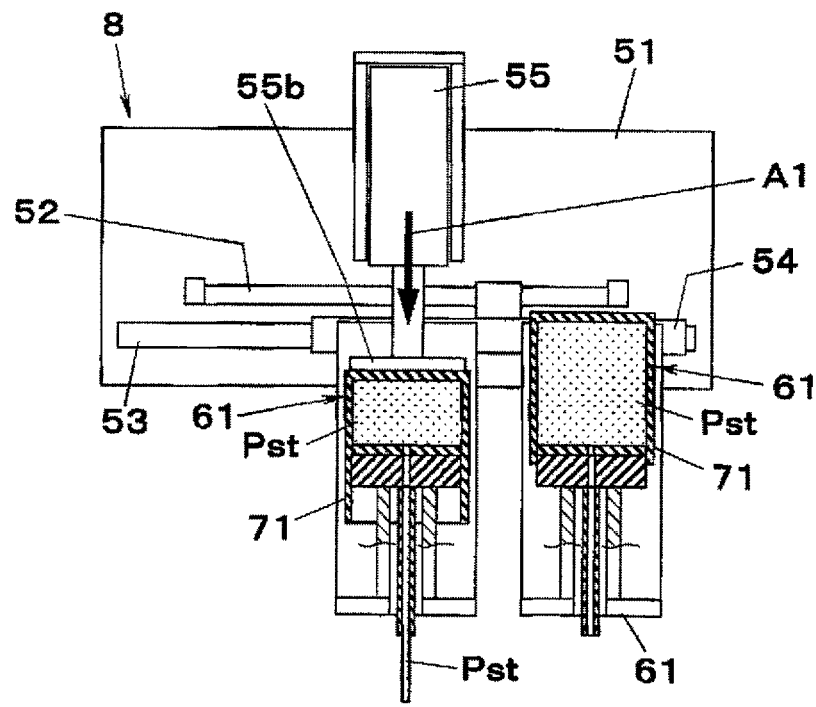
FIGS. 7A and 7B are operation explanatory diagrams of the paste supply apparatus in one embodiment of the invention.
Figure 7B:
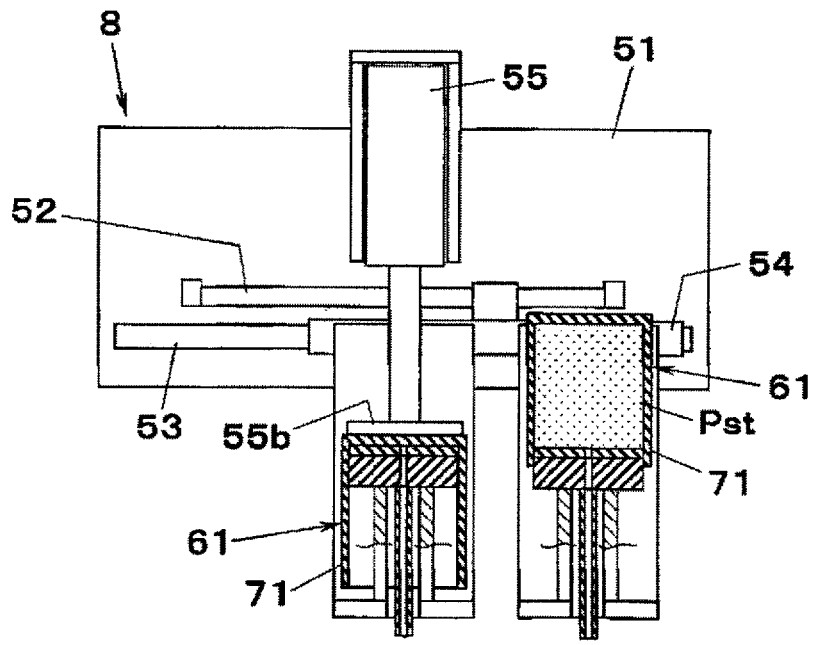

In a state in which the two paste pots 61 are held in the pot holder 54 as described above, the controller 100 actuates the moving cylinder 52 to move the piston rod 55a downward to protrude while the pot holder 54 is positioned at the first position (that is, the left paste pot 61 is positioned at the ejection position) (FIG. 7A; arrow A1). Accordingly, the moveable bottomed tubular container 71 is depressed with respect to the inner lid 72 and the paste Pst is ejected downward from the through hole 61S of the left paste pot 61. Ejection of the paste Pst from the paste pot 61 is completed at the time when the bottom portion 71a of the tubular portion 71 abuts on the inner lid 72 (FIG. 7B). The completion of ejection 9 of the paste Pst in the paste pot 61 positioned at the ejection position is detected by an ejection completion detector 55c (FIG. 6) such as a stroke sensor which is provided inside the pressing cylinder 55 and which detects a stroke of the piston rod 55a.

Figure 8A:
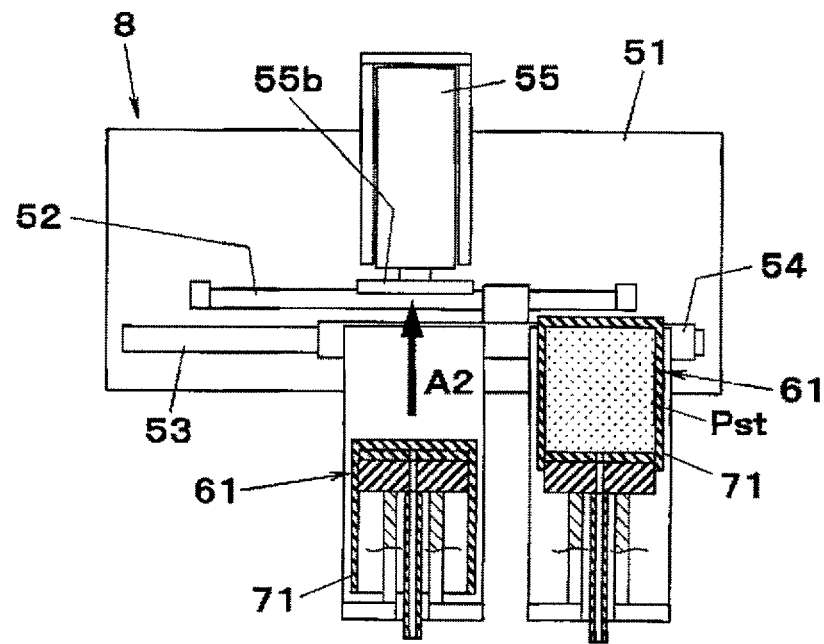
FIGS. 8A and 8B are operation explanatory diagrams of the paste supply apparatus in one embodiment of the invention.
Figure 8B:
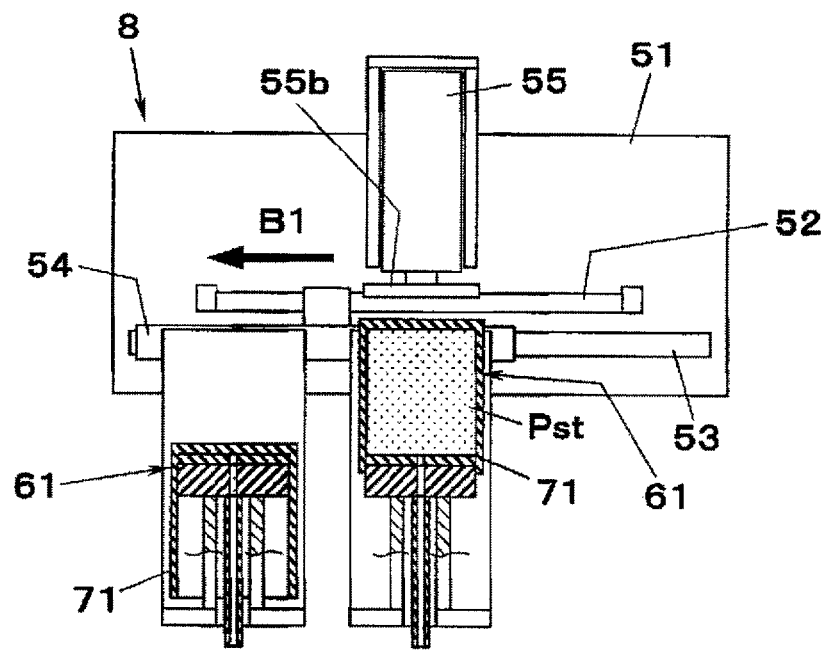
Figure 9A:
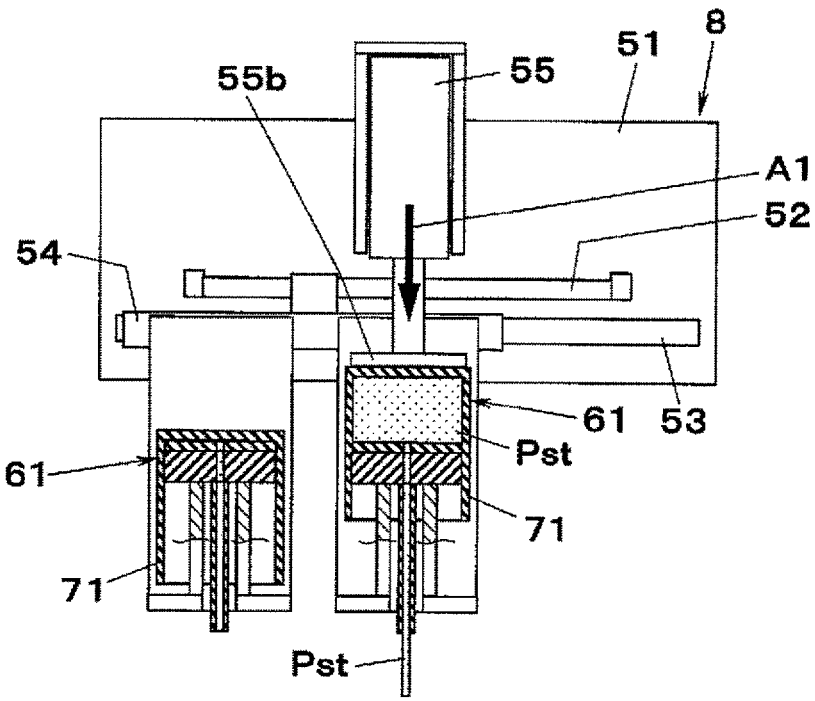
FIGS. 9A and 9B are operation explanatory diagrams of the paste supply apparatus in one embodiment of the invention.

After ejection of the paste Pst from the left paste pot 61 is started, if the ejection completion detector 55c detects completion of ejection of the paste Pst in the paste pot 61 (FIG. 7B), the controller 100 actuates the pressing cylinder 55 to move in a direction (i.e., upward direction) opposite to the direction at the time of depressing the moveable bottomed tubular container 71 so as to position the pad member 55b above the left paste pot 61 (FIG. 8A; arrow A2). Then, the controller 100 actuates the moving cylinder 52 so as to position the pot holder 54 at the second position, whereby the right paste pot 61 is positioned at the ejection position (FIG. 8B; arrow B1). In other words, the paste pot 61 (empty paste pot 61) having existed at the ejection position is positioned at the standby position deviating from the ejection position, and the paste pot 61 (new paste pot 61) having existed at the standby position is positioned at the ejection position. After the right paste pot 61 is positioned at the ejection position, the controller 100 moves the piston rod 55a downward to protrude (FIG. 9A; arrow A1). Accordingly, the moveable bottomed tubular container 71 is depressed with respect to the inner lid 72, and the paste Pst is ejected downward from the through hole 61S of the right paste pot 61 (FIG. 9A).

Figure 9B:
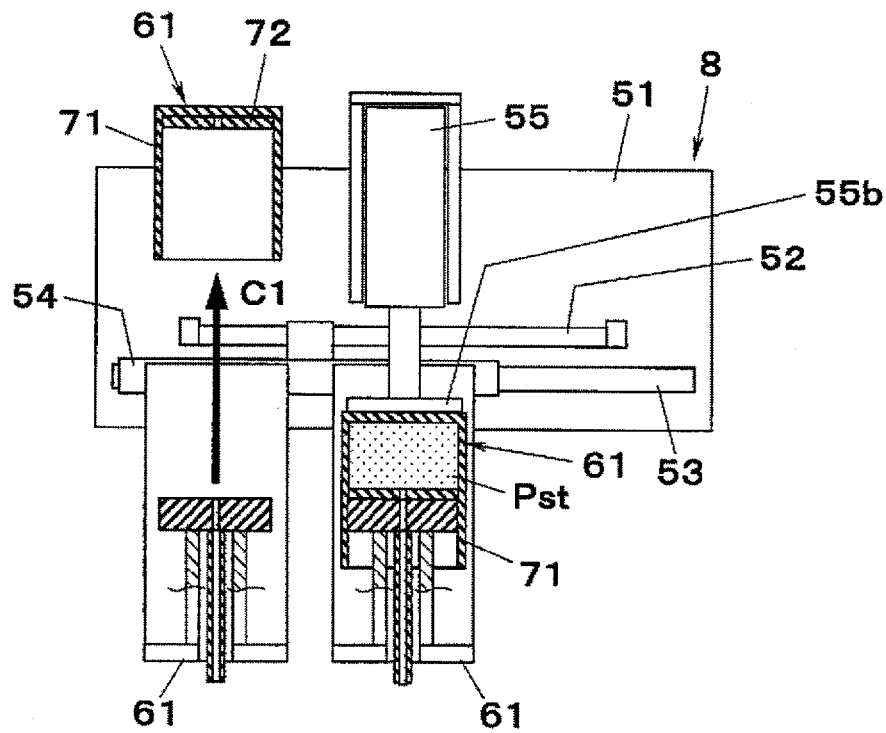
Figure 10A:
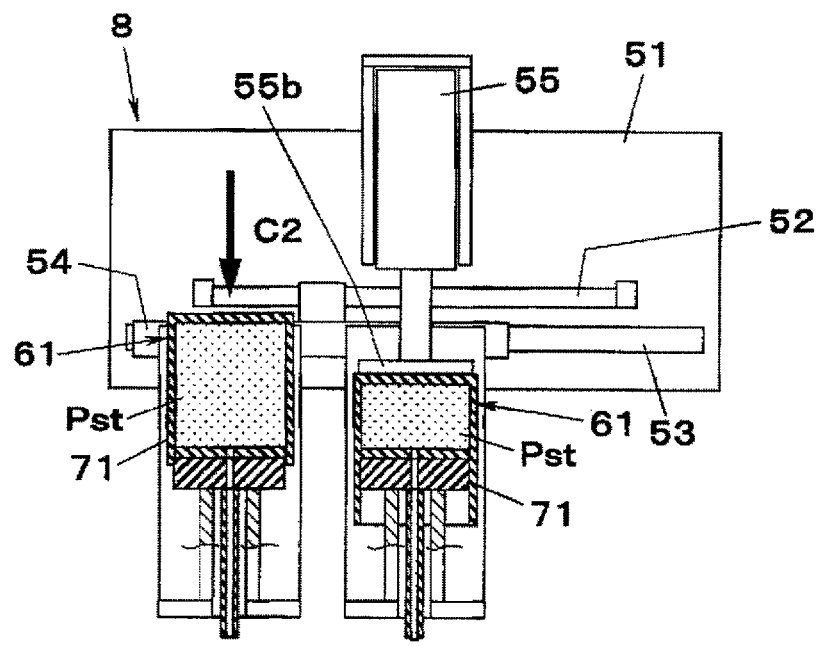
FIGS. 10A and 10B are operation explanatory diagrams of the paste supply apparatus in one embodiment of the invention.

When or after the pot holder 54 is switched from the first position to the second position, the controller 100 actuates a notification device 101 (FIG. 6) such as a lamp connected to the controller 100 so as to provide notification that the empty paste pot 61 should be replaced with a new paste pot 61. Based on notification operation by the notification device 101, the operator OP watches for a timing when ejection operation of the paste Pst by the paste supply apparatus 8 is not performed, and at the timing, the operator OP detaches the left empty paste pot 61 from the left pot attachment portion 82 (FIG. 9B; arrow C1) and then attaches the new paste pot 61 to the left pot attachment portion 82 so as to hold the new paste pot 61 in the pot holder 54 (FIG. 10A; arrow C2). The replacement work of the paste pot 61 is very easy, thereby being capable of being performed without stopping operation of whole functions of the screen printing machine 1.

Figure 10B:
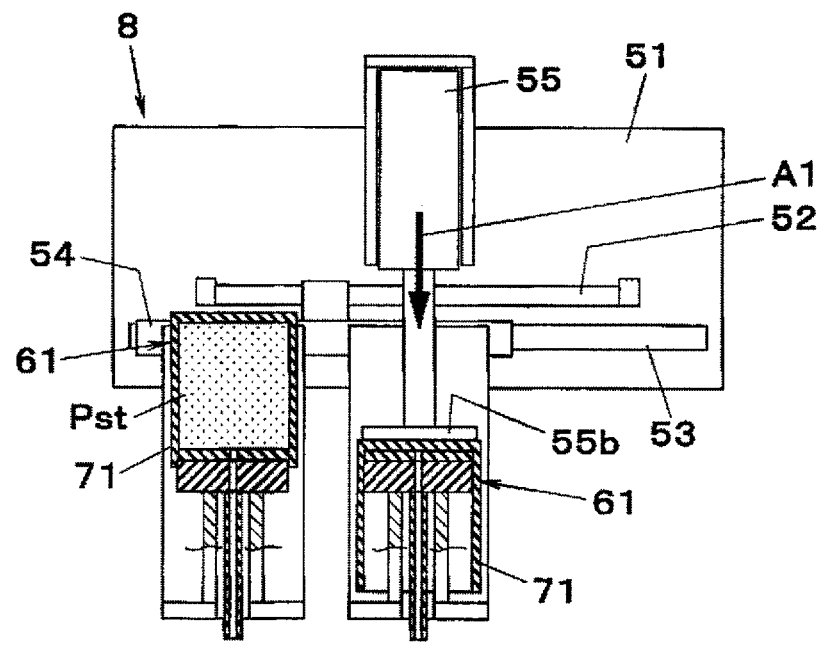
Figure 11A:
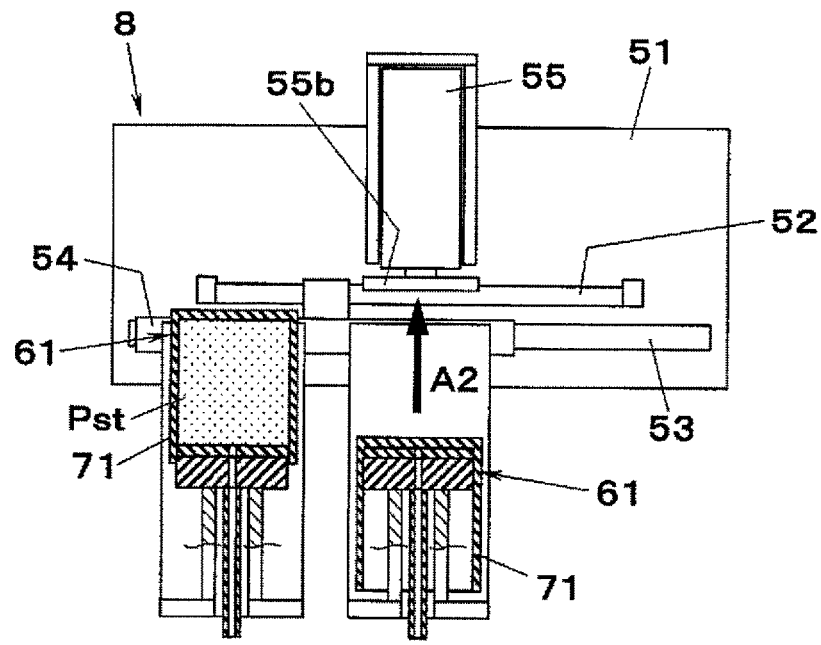
FIGS. 11A and 11B are operation explanatory diagrams of the paste supply apparatus in one embodiment of the invention.
Figure 11B:
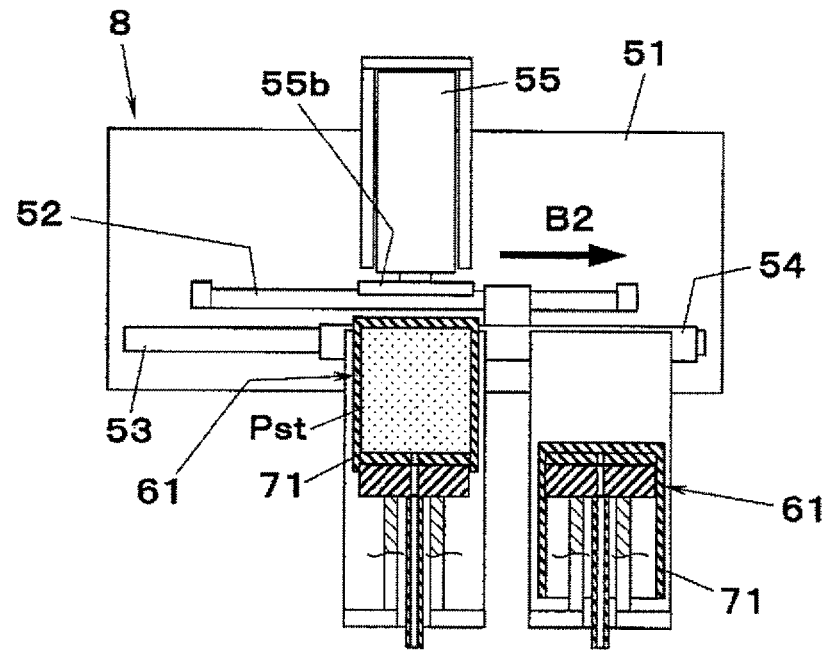
Figure 12A:
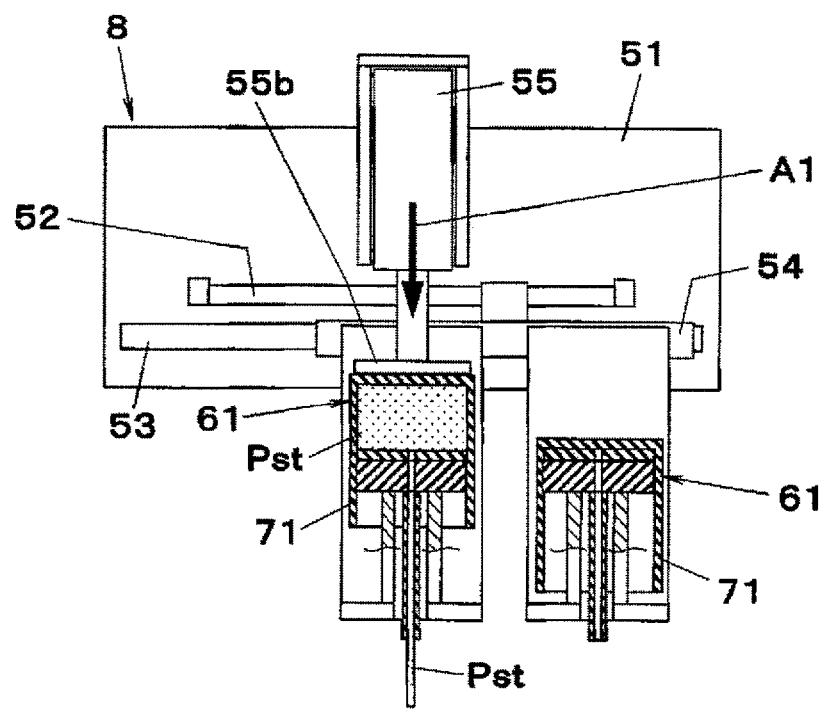
FIGS. 12A and 12B are operation explanatory diagrams of the paste supply apparatus in one embodiment of the invention.
Figure 12B:
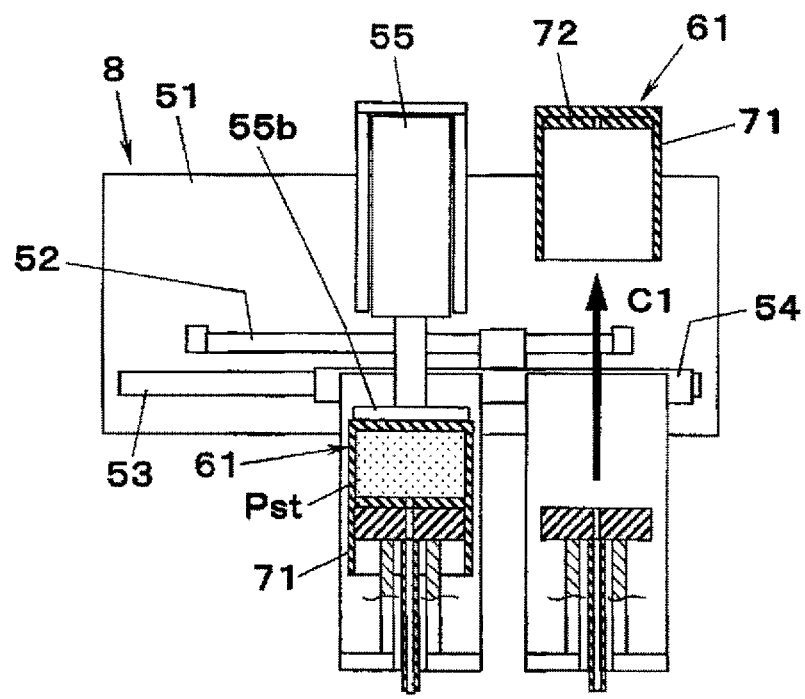

After ejection of the paste Pst from the right paste pot 61 is started, if the ejection completion detector 55c detects completion of ejection of the paste Pst in the paste pot 61 (FIG. 10B; arrow A1), the controller 100 actuates the pressing cylinder 55 in a direction (i.e., upward direction) opposite to the direction at the time of depressing the moveable bottomed tubular container 71 so as to position the pad member 55b above the right paste pot 61 (FIG. 11A; arrow A2). Then, the controller 100 actuates the moving cylinder 52 so as to position the left paste pot 61 at the ejection position (FIG. 11B; arrow B2). In other words, the paste pot 61 (empty paste pot 61) having existed at the ejection position is positioned at the standby position deviating from the ejection position, and the paste pot 61 (new paste pot 61) having existed at the standby position is positioned at the ejection position. After the left paste pot 61 is positioned at the ejection position, the controller 100 moves the piston rod 55a downward to protrude (FIG. 12A; arrow A1). Accordingly, the moveable bottomed tubular container 71 is depressed with respect to the inner lid 72, and the paste Pst is ejected downward from the left paste pot 61 (FIG. 12B).

When or after the pot holder 54 is switched from the second position to the first position, the controller 100 actuates the notification device 101 described above, and provides notification that the empty paste pot 61 should be replaced with a new paste pot 61. Based on notification operation by the notification device 101, the operator OP watches for a timing when ejection operation of the paste Pst by the paste supply apparatus 8 is not performed, and at the timing, the operator OP detaches the right empty paste pot 61 from the right pot attachment portion 82 (FIG. 12B; arrow C1), and then attaches the new paste pot 61 to the right pot attachment portion 82 so as to hold the new paste pot 61 in the pot holder 54. Accordingly, since the state changes (returns) to the state of FIG. 7A described above, the paste supply operation can subsequently be continued without running out of the paste Pst.

As described above, the paste supply apparatus 8 according to the embodiment includes the ejection completion detector 55c which detects the completion of ejection of the paste Pst in the paste pot 61 positioned at the ejection position, and if the ejection completion detector detects the completion of ejection of the paste Pst in the paste pot 61 positioned at the ejection position, the controller 100 performs control such that the paste pot 61 (empty paste pot 61) having existed at the ejection position is moved to the standby position deviating from the ejection position and the paste pot 61 (new paste pot 61) having existed at the standby position is moved to the ejection position.

Next, an execution procedure (screen printing method) of screen printing work by the screen printing machine 1 will be described. In this procedure, at first, the operator OP operates an input unit 102 (FIG. 6) connected to the controller 100 for starting a predetermined screen printing work. On receiving the input for starting the screen printing work, the controller 100 receives and conveys the substrate 2 loaded from the outside of the screen printing machine 1 by the conveyors 16, and positions the substrate 2 at a work position of below a space between the pair of clampers 18. After the second lifting table 14 is moved upward with respect to the first lifting table 13 and a lower surface of the substrate 2 is supported by the receiving member 17, the second lifting table 14 is moved further upward and the substrate 2 is lifted from the conveyors 16, and both ends of the substrate 2 are clamped and held from the Y-axis direction by a pair of clampers 18.

After the substrate 2 is clamped, the controller 100 moves the camera unit 7 to enter a space under the mask 5. The camera unit 7 images the substrate side marks 2m provided on the substrate 2 from above the substrate 2 by the downward imaging camera 32, thereby obtaining image data of the substrate side marks 2m. The camera unit 7 also images the mask side marks 5m provided on the mask 5 from below the mask 5 by the upward imaging camera 31, thereby obtaining image data of the mask side marks 5m. Then, image recognition based on the obtained image data of the substrate side marks 2m is performed to calculate a position of the substrate 2, and image recognition based on the image data of the mask side marks 5m is performed to calculate a position of the mask 5.

After the position of the substrate 2 and the position of the mask 5 are calculated, the controller 100 moves the camera unit 7 at a position deviating from the space under the mask 5. Then, actuation control of the XYθ movement mechanism 11 is performed to move the substrate 2 so as to position the substrate side marks 2m under (e.g., just under) the mask side marks 5m. Accordingly, the positioning of the substrate 2 is performed with respect to the mask 5.

Figure 13:
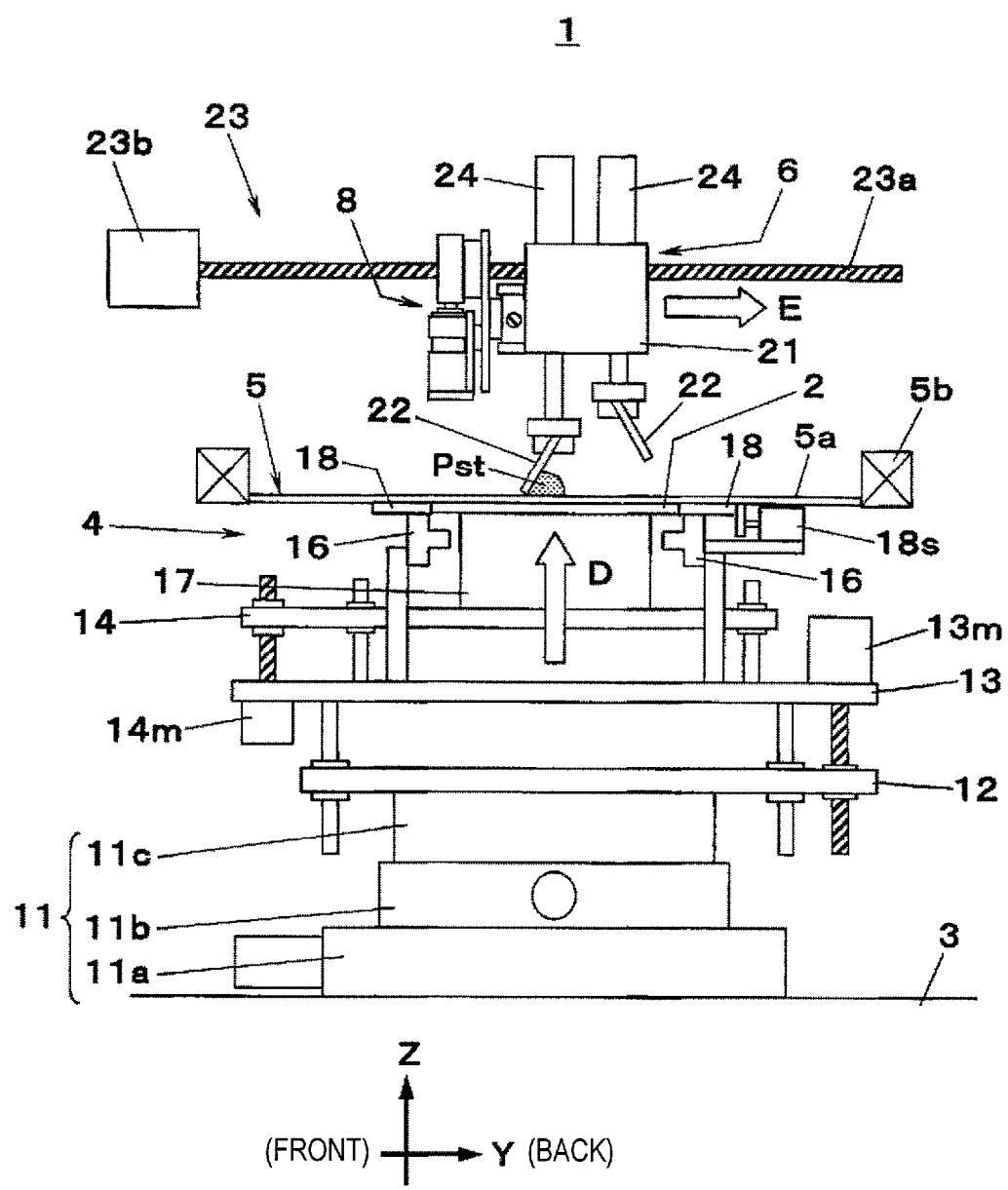
FIG. 13 is a side view of the screen printing machine in one embodiment of the invention.

After the substrate 2 is positioned with respect to the mask 5, the controller 100 moves the first lifting table 13 of the substrate holding/moving unit 4 upward with respect to the base table 12 (FIG. 13; arrow D). Accordingly, the electrodes 2a of the substrate 2 match with the pattern holes 5h of the mask 5, and an upper surface of the substrate 2 and upper surfaces of the clampers 18 are positioned to contact a lower surface of the mask 5 (a contact step).

After the substrate 2 is positioned to contact the mask 5, the controller 100 moves the squeegee base 21 in the Y-axis direction, and also moves the paste supply apparatus 8 in a paste supply attitude at a given or predetermined position (normally, at a position above a portion of the mask 5 which contacts the front damper 18). Then, the paste supply apparatus moving motor 44 is actuated so as to move the paste supply apparatus 8 in the X-axis direction such that the pot holder 54 is moved in a direction (X-axis direction) in which the two paste pots 61 are arranged so as to selectively position one of the two paste pots 61 at a given or predetermined ejection position (a pot holder moving step). In this state, the moveable bottomed tubular container 71 of the paste pot 61 positioned at the ejection position is depressed with respect to the inner lid 72, whereby the paste Pst is ejected from the through hole 61S of the paste pot 61 (an ejecting step). Accordingly, the paste Pst is supplied to the mask 5 (a paste supply step). In the paste supply step, if the notification device 101 provides the notification that the empty paste pot 61 containing no paste Pst should be replaced with a new paste pot 61, the operator OP performs replacement work of the paste pot 61 according to this notification.

After the paste Pst is supplied to the mask 5, the controller 100 moves one squeegee 22 downward with respect to the squeegee base 21 so as to abut the lower end of the squeegee 22 on the mask 5, and moves the squeegee base 21 in the Y-axis direction (FIG. 13; arrow E), whereby the squeegee 22 is slid on the mask 5 (a squeegee sliding step). Accordingly, the paste Pst supplied to the mask 5 by the paste supply step is scraped by the squeegee 22, and the paste Pst is transferred to the electrodes 2a of the substrate 2 through the pattern holes 5h of the mask 5.

When the paste Pst is transferred, the controller 100 abuts the front squeegee 22 (left side of paper of FIG. 13) on the mask 5 when the squeegee base 21 is moved from the front to the back of the screen printing machine 1 (from the left to the right in FIG. 13), and abuts the back squeegee 22 (right side of paper of FIG. 13) on the mask 5 when the squeegee base 21 is moved from the back to the front of the screen printing machine 1 (from the right to the left in FIG. 13).

After the transfer work of the paste Pst is completed, the controller 100 moves the first lifting table 13 downward so as to separate the substrate 2 from the mask 5. Further, holding (clamping) of the substrate 2 by a pair of clampers 18 is released, and thereafter, the second lifting table 14 is moved downward and the substrate 2 is lowered on the conveyors 16. Then, the conveyors 16 are actuated to carry the substrate 2 to the outside of the screen printing machine 1. Accordingly, the screen printing work per sheet of the substrate 2 is completed.

According to the screen printing machine 1 and the screen printing method by the screen printing machine 1 (the paste supply apparatus 8 and the paste supply method by the paste supply apparatus 8) in the embodiment as described above, after ejection of the paste Pst in one paste pot 61 (first paste pot) is completed, another paste pot 61 (second paste pot) is positioned at the ejection position and also the empty (first) paste pot 61 is positioned at the position (standby position) deviating from the ejection position. Consequently, the paste Pst can subsequently be ejected from the (second) paste pot 61. Further, during that period, the empty (first) paste pot 61 can be replaced with a new paste pot 61, whereby the paste pot 61 can be replaced without stopping operation of whole functions of the screen printing machine 1. Therefore, work efficiency can be improved.

In the embodiment described above, the pot holder 54 holds two paste pots 61 and the pot holder moving device (moving cylinder 52) selectively positions one of the two paste pots 61 at the ejection position. However, the number of paste pots 61 held by the pot holder 54 is not limited to two, and may be arbitral as long as the number of paste pots 61 is multiple (i.e., two or more).

As described above, the embodiment of the invention provides a paste supply apparatus, a screen printing machine, a paste supply method and a screen printing method, which can replace a paste pot without stopping operation of whole functions of the screen printing machine.

Although the invention has been described in detail with reference to specific embodiments, various changes or modifications may be made without departing from the spirit and scope of the invention.

This application is based on Japanese Patent Application No. 2013-123506, filed Jun. 12, 2013, the entire contents of which are incorporated herein by reference.

What is claimed is:

1. A paste supply apparatus comprising:
   a plurality of paste pots, each of which comprises a moveable bottomed tubular container which stores paste and an inner lid which is provided in the moveable bottomed tubular container and which has a through hole formed in a center portion of the inner lid;
   a pot holder comprising a ring-shaped inner lid support portion and which holds the plurality of paste pots so as to be horizontally arranged along an arrangement direction such that the through hole of each of the plurality of paste pots is directed downward and downward movement of the movable bottomed tubular container thereof is regulated;
   a pot holder moving device which moves the pot holder along the arrangement direction and which selectively positions one of the plurality of paste pots at an ejection position;
   a paste ejecting device which depresses the moveable bottomed tubular container of the paste pot positioned at the ejection position and moves the moveable bottomed tubular container with respect to the inner lid to ejects the paste stored in the moveable bottomed tubular container downward from the through hole of the paste pot; and
   wherein at least one of the plurality of paste pots is held on the pot holder at a position deviating from the ejection position.

2. A screen printing machine comprising:
   a mask which is positioned to contact a substrate;
   a paste supply apparatus according to claim 1, which ejects and supplies the paste to the mask contacting the substrate; and
   a squeegee sliding on the mask to which the paste is supplied by the paste supply apparatus.

3. The screen printing machine according to claim 2, wherein the arrangement direction is the same as a sliding direction of the squeegee.

4. The screen printing machine according to claim 2, wherein the pot holder moving device is configured to move the pot holders in a sliding direction of the squeegee.

5. A screen printing method comprising:
positioning a mask to contact a substrate;
ejecting and supplying the paste from the paste supply apparatus according to claim 1 to the mask contacting the substrate; and
sliding a squeegee on the mask to which the paste is supplied.

6. The screen printing method according to claim 5, wherein the arrangement direction is the same as a sliding direction of the squeegee.

7. The screen printing method according to claim 5, wherein the pot holder moving device is configured to move the pot holders in a sliding direction of the squeegee.

8. A paste supply method comprising:
holding a plurality of paste pots, each of which comprises a moveable bottomed tubular container which stores paste, and an inner lid which is provided in the moveable bottomed tubular container and which has a through hole formed in a center portion of the inner lid, so as to be horizontally arranged along an arrangement direction in a pot holder comprising a ring-shaped inner lid support portion such that the inner lid abuts on the ring-shaped inner lid support portion from above and the through hole of each of the plurality of paste pots is directed downward and downward movement of the movable bottomed tubular container thereof is regulated;
moving the pot holder in the arrangement direction and selectively positioning one of the plurality of paste pots at an ejection position; and
depressing the moveable bottomed tubular container of the paste pot positioned at the ejection position and moving the moveable bottomed tubular container with respect to the inner lid and ejecting the paste stored in the moveable bottomed tubular container from the through hole,
wherein at least one of the plurality of paste pots is held on the pot holder at a position deviating from the ejection position.

* * * * *